(12) United States Patent
Asayama (10) Patent No.: US 10,566,273 B2
(45) Date of Patent: Feb. 18, 2020

(54) CHIP-ON-FILM SEMICONDUCTOR DEVICE

(71) Applicant: SHARP KABUSHIKI KAISHA, Sakai, Osaka (JP)

(72) Inventor: Nobuaki Asayama, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/203,219

(22) Filed: Nov. 28, 2018

(65) Prior Publication Data

US 2019/0164874 A1 May 30, 2019

(30) Foreign Application Priority Data

Nov. 29, 2017 (JP) ................................. 2017-229457

(51) Int. Cl.
*H01L 23/48* (2006.01)
*H01L 23/52* (2006.01)
*H01L 29/40* (2006.01)
*H01L 23/498* (2006.01)

(52) U.S. Cl.
CPC .. *H01L 23/49811* (2013.01); *H01L 23/49838* (2013.01); *H01L 2224/16225* (2013.01); *H01L 2224/32225* (2013.01); *H01L 2224/73204* (2013.01)

(58) Field of Classification Search
USPC ........ 257/734, 625, 676, 779–783, 784–785, 257/E27.137, E27.144, E27.161, E23.023, 257/E23.077, E21.122–E21.128, E21.48, 257/E21.512, E21.567–E21.57, 257/E21.087–E21.088, E21.6–E21.601; 438/613, 612, 109, 15
See application file for complete search history.

(56) References Cited

U.S. PATENT DOCUMENTS

| | | | |
|---|---|---|---|
| 2002/0076495 A1 | 6/2002 | Maloney et al. | |
| 2007/0290302 A1 | 12/2007 | Nakagawa et al. | |
| 2018/0151537 A1* | 5/2018 | Huang | H01L 23/49827 |
| 2019/0333849 A1* | 10/2019 | Furuichi | H01L 23/49822 |

FOREIGN PATENT DOCUMENTS

| | | |
|---|---|---|
| EP | 2007180 A1 | 12/2008 |
| JP | 2001-318620 A | 11/2001 |
| TW | 513745 B | 12/2002 |
| TW | 200814244 A | 3/2008 |

* cited by examiner

*Primary Examiner* — Niki H Nguyen
(74) *Attorney, Agent, or Firm* — ScienBiziP, P.C.

(57) ABSTRACT

A chip-on-film semiconductor device includes a translucent insulator film, a first wire group including a plurality of wires on a first surface of the insulator film, a second wire group including a plurality of opaque wires on a second surface of the insulator film opposite to the first surface, and a semiconductor chip mounted on the first surface. The wires of the first wire group and semiconductor connection terminals of the semiconductor chip are joined together at junction portions. The second surface includes an unwired region, in which none of the wires of the second wire group are disposed, at a portion corresponding to any of the junction portions.

6 Claims, 13 Drawing Sheets

CHIP-ON-FILM SEMICONDUCTOR DEVICE

BACKGROUND

1. Field

The present disclosure relates to a structure of a chip-on-film (COF) semiconductor device, and particularly to a characteristic wiring design of a double-sided wiring tape carrier and a subsequent assembly process.

2. Description of the Related Art

Chip-on-film semiconductor devices are used to, for example, drive a display of a mobile terminal device, such as a cellular phone.

Generally, a tape carrier included in a chip-on-film semiconductor device has a structure including multiple wiring patterns on an insulator film.

Figure 10:
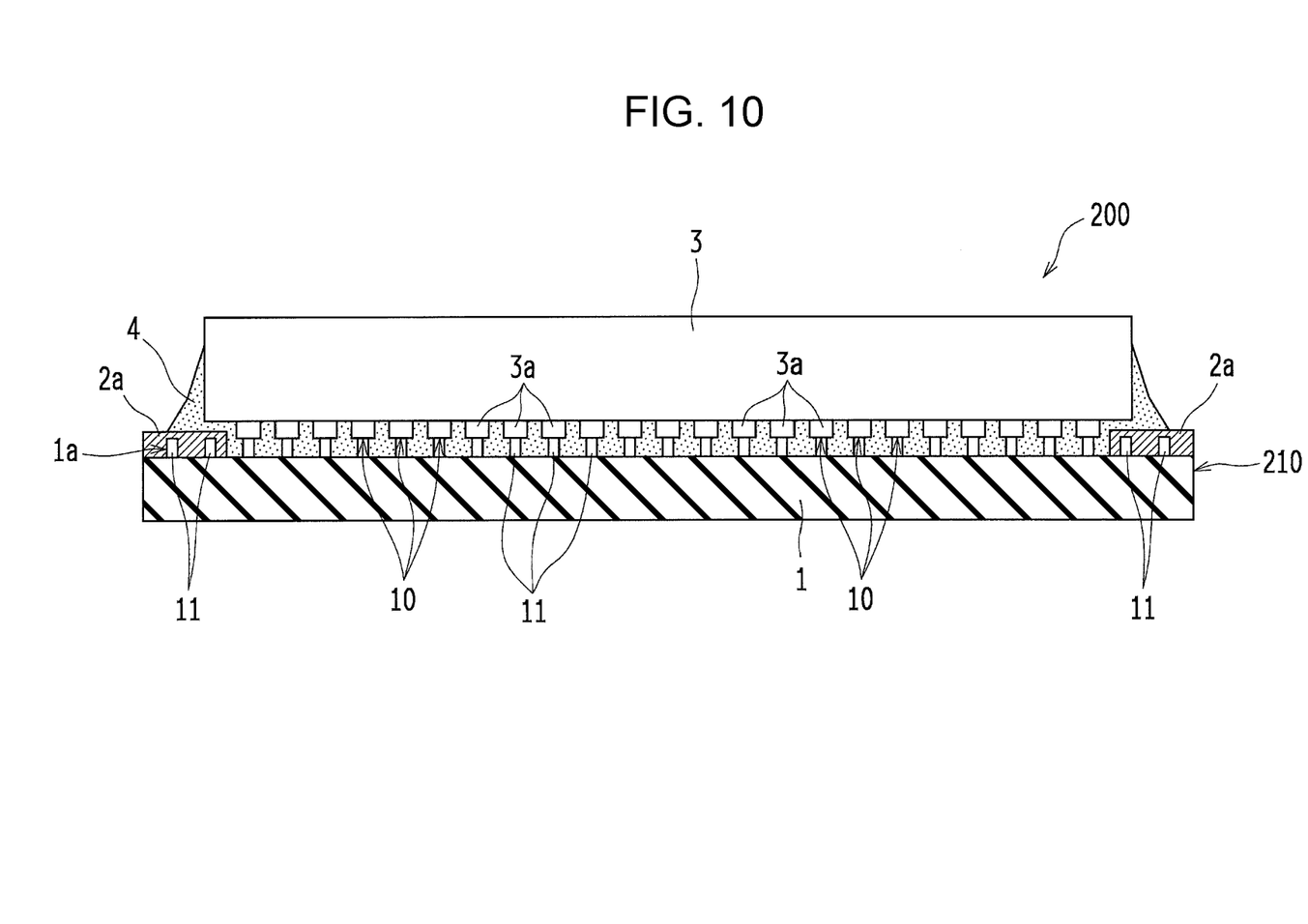
FIG. 10 is a schematic cross-sectional view of an example of a chip-on-film semiconductor device including a single-sided wiring tape carrier.
Figure 11:
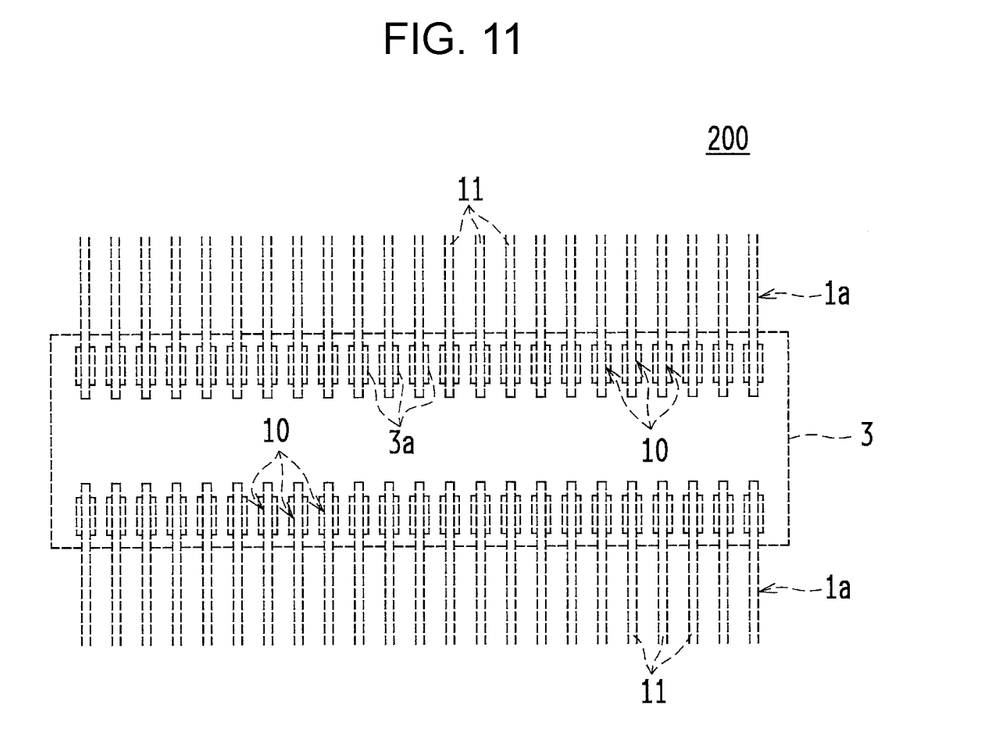
FIG. 11 is a schematic bottom view of the chip-on-film semiconductor device illustrated in FIG. 10, viewed from the surface of the tape carrier opposite to the chip mount surface.

FIG. 10 is a schematic cross-sectional view of an example of a chip-on-film semiconductor device 200 including a single-sided wiring tape carrier 210. FIG. 11 is a schematic bottom view of the chip-on-film semiconductor device 200 illustrated in FIG. 10, viewed from the surface of the tape carrier opposite to a chip mount surface.

As illustrated in FIG. 10, the chip-on-film semiconductor device 200 including the single-sided wiring tape carrier 210 includes an insulator film 1, a first wire group 1a, first protective layers 2a, a semiconductor chip 3, and a resin 4. The first protective layers 2a are disposed to insulate or protect wires 11 of the first wire group 1a. The semiconductor chip 3 includes semiconductor connection terminals 3a. The resin 4 protects and fixes junction portions 10 between the wires 11 of the first wire group 1a and the semiconductor connection terminals 3a of the semiconductor chip 3.

The insulator film 1, the first protective layers 2a, and the resin 4 of the chip-on-film semiconductor device 200 are usually made of translucent materials. This is because this structure enables visual checking of the state or misalignment of the junctions between the wires 11 of the first wire group 1a and the semiconductor connection terminals 3a from the surface of the tape carrier opposite to the chip mount surface (the surface on which the semiconductor chip 3 is mounted) also after the semiconductor chip 3 is mounted on the insulator film 1 and sealed with the resin 4.

To manufacture products having a stable quality, it is very important to enable visual checking of the state or misalignment of junctions between the wires 11 of the first wire group 1a and the semiconductor connection terminals 3a.

As illustrated in FIG. 10 and FIG. 11, the single-sided wiring tape carrier 210 includes the insulator film 1 that is translucent when viewed from the surface opposite to the chip mount surface. Thus, the state of junctions between the wires 11 of the first wire group 1a and the semiconductor connection terminal 3a can be checked. This structure facilitates monitoring of the state of junctions between the wires 11 of the first wire group 1a and the semiconductor connection terminals 3a during manufacturing of the products.

With regard to this point, Japanese Unexamined Patent Application Publication No. 2001-318620 discloses a technology of mounting a tape carrier on a display panel such that a leadless portion of a display panel and a dummy wire of the tape carrier overlap each other, and observing the dummy wire of the tape carrier through the display panel to check a connection state of an anisotropic conductive film (ACF) on the basis of, for example, the degree of squash of the ACF.

In these years, the size reduction of mobile terminal devices such as cellular phones and the increase in definition of display screens require tape carriers to reduce their size and increase their output.

Thus, to increase the output, wiring patterns have been arranged at finer pitches. The wiring technology and the assembly technology, however, have reached their limits. Thus, to further increase the output, double-sided wiring tape carriers have been currently used as tape carriers.

Figure 12:
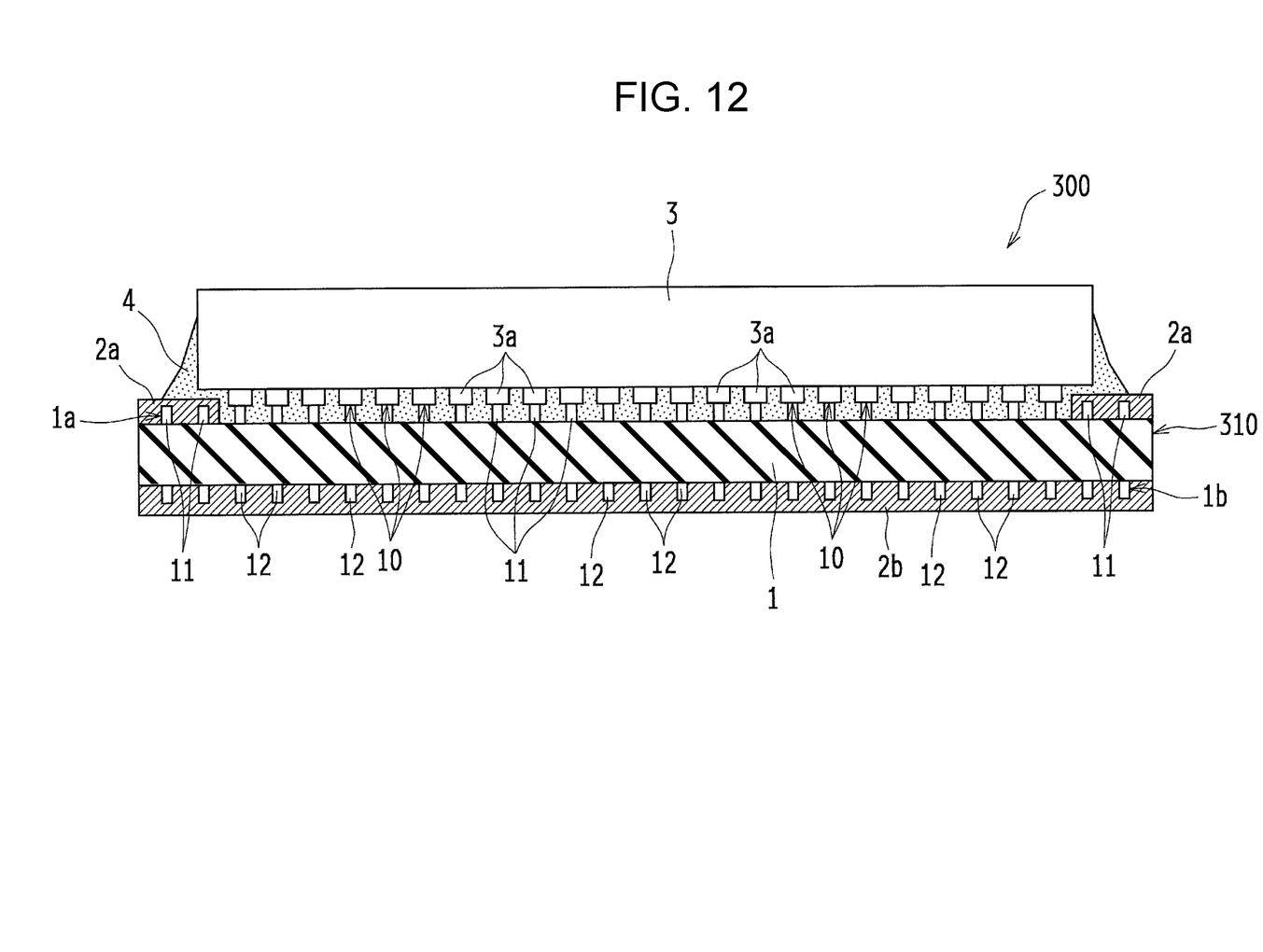
FIG. 12 is a schematic cross-sectional view of an example of an existing chip-on-film semiconductor device including a double-sided wiring tape carrier.
Figure 13:
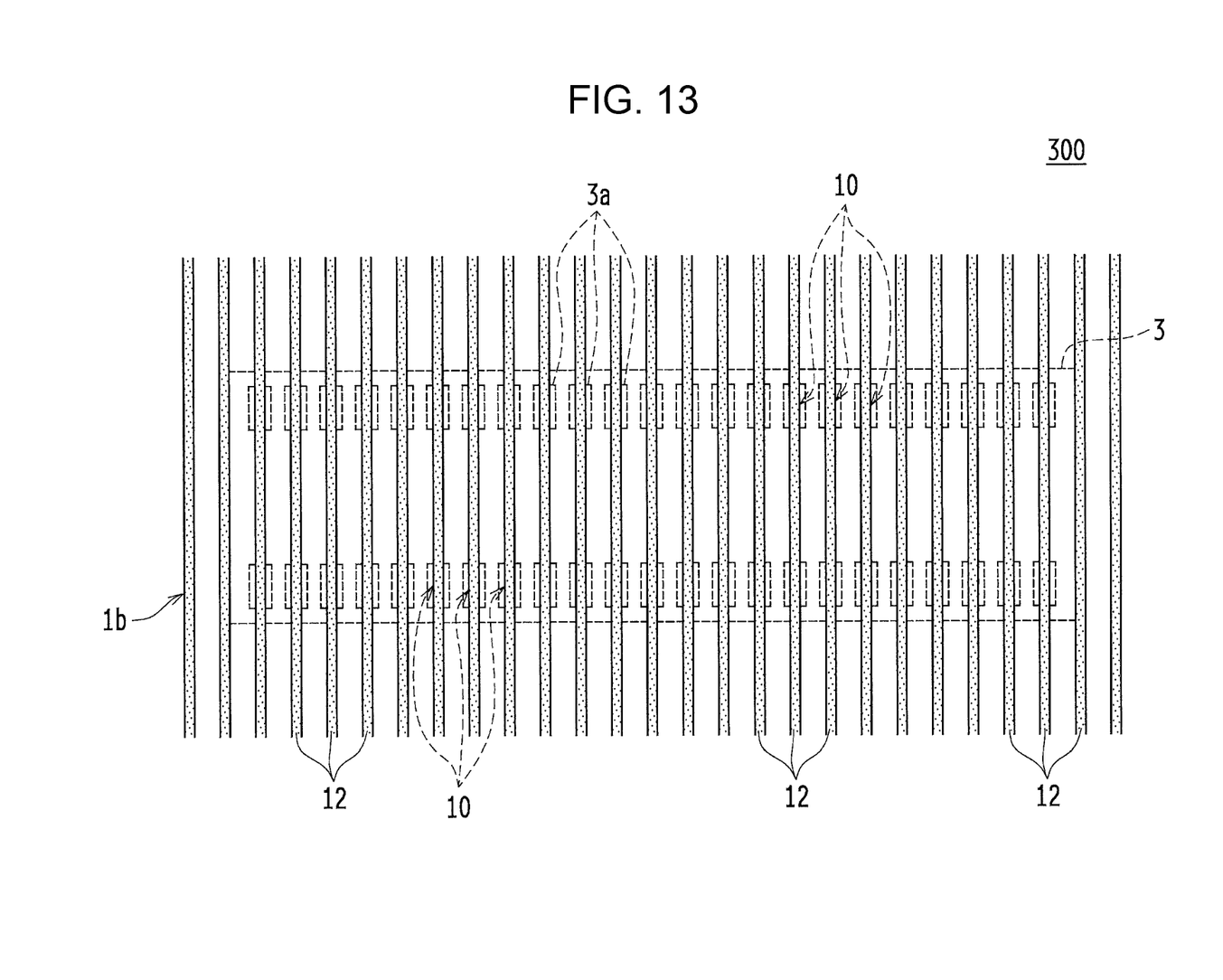
FIG. 13 is a schematic bottom view of the chip-on-film semiconductor device illustrated in FIG. 12, viewed from the surface of the tape carrier opposite to the chip mount surface.

FIG. 12 is a schematic cross-sectional view of an example of an existing chip-on-film semiconductor device 300 including a double-sided wiring tape carrier 310. FIG. 13 is a schematic bottom view of the chip-on-film semiconductor device 300 illustrated in FIG. 12, viewed from the surface of the tape carrier opposite to the chip mount surface.

As illustrated in FIG. 12 and FIG. 13, in order to most effectively use the effective area on the surfaces of the double-sided wiring tape carrier 310, the existing chip-on-film semiconductor device 330 including the double-sided wiring tape carrier 310 includes a second wire group 1b and a second protective layer 2b on the surface opposite to the chip mount surface, besides the components illustrated in FIG. 10 and FIG. 11. The second protective layer 2b is provided to insulate and protect wires 12 of the second wire group 1b. The second protective layer 2b is made of the same material as that of the first protective layer 2a.

The second wire group 1b is disposed on the surface of the double-sided wiring tape carrier 310 opposite to the chip mount surface. After the semiconductor chip 3 is mounted on the double-sided wiring tape carrier 310, the opaque wires 12 of the second wire group 1b are disposed on the double-sided wiring tape carrier 310. The wires 12 of the second wire group 1b are disposed at portions corresponding to (overlapping) at least one of the junction portions 10 (all the junction portions 10 in this example). Thus, the wires 12 of the second wire group 1b hinder an operator from visually checking the state of junctions between the wires 11 of the first wire group 1a and the semiconductor connection terminals 3a from the surface of the tape carrier opposite to the chip mount surface.

As in this structure, in the structure including the second wire group 1b disposed at a portion corresponding to the junction portions 10 on the surface of the double-sided wiring tape carrier 310 opposite to the chip mount surface, the state or misalignment of junctions between the wires 11 of the first wire group 1a and the semiconductor connection terminals 3a may be failed to be monitored during manufacture, and high quality products may fail to be provided.

It is desirable to provide a chip-on-film semiconductor device including a double-sided wiring tape carrier that reliably allows an operator to check the state of junctions between wires of a first wire group and semiconductor connection terminals of a semiconductor chip, and thus achieves high quality.

SUMMARY

According to an aspect of the disclosure, there is provided a chip-on-film semiconductor device that includes a translucent insulator film, a first wire group including a plurality of wires on a first surface of the insulator film, a second wire group including a plurality of opaque wires on a second surface of the insulator film opposite to the first surface, and a semiconductor chip mounted on the first surface. The wires of the first wire group and semiconductor connection terminals of the semiconductor chip are joined together at junction portions. The second surface includes an unwired region, in which none of the wires of the second wire group are disposed, at a portion corresponding to any of the junction portions.

DESCRIPTION OF THE EMBODIMENTS

Embodiments of the present disclosure are described below with reference to the drawings. In the following description, the same components are denoted with the same reference signs. The same components have the same names and functions. Thus, the same components are not repeatedly described in detail.

Embodiment 1

Figure 1:
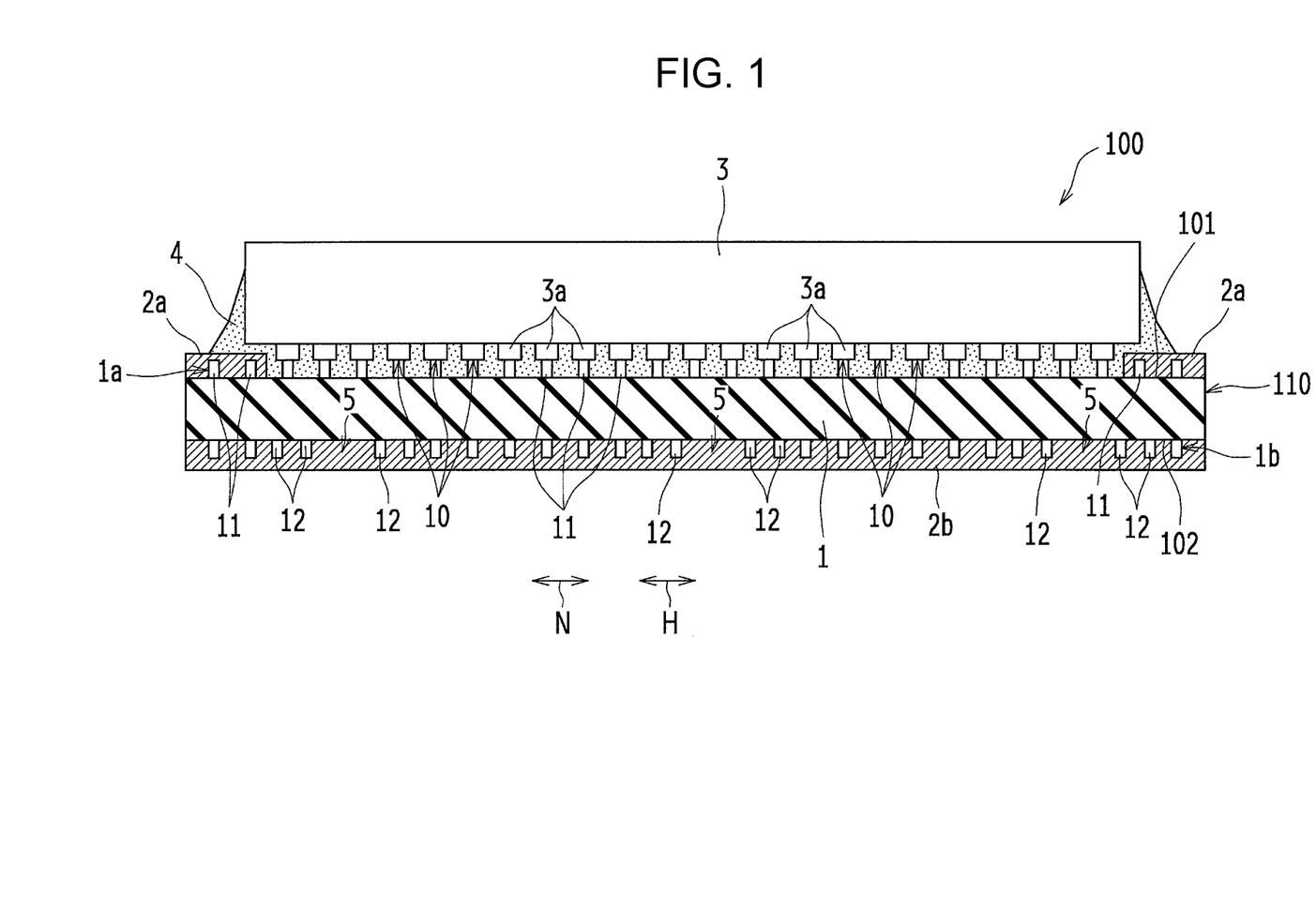
FIG. 1 is a schematic cross-sectional view of an example of a chip-on-film semiconductor device according to embodiment 1 including a double-sided wiring tape carrier.
Figure 2:
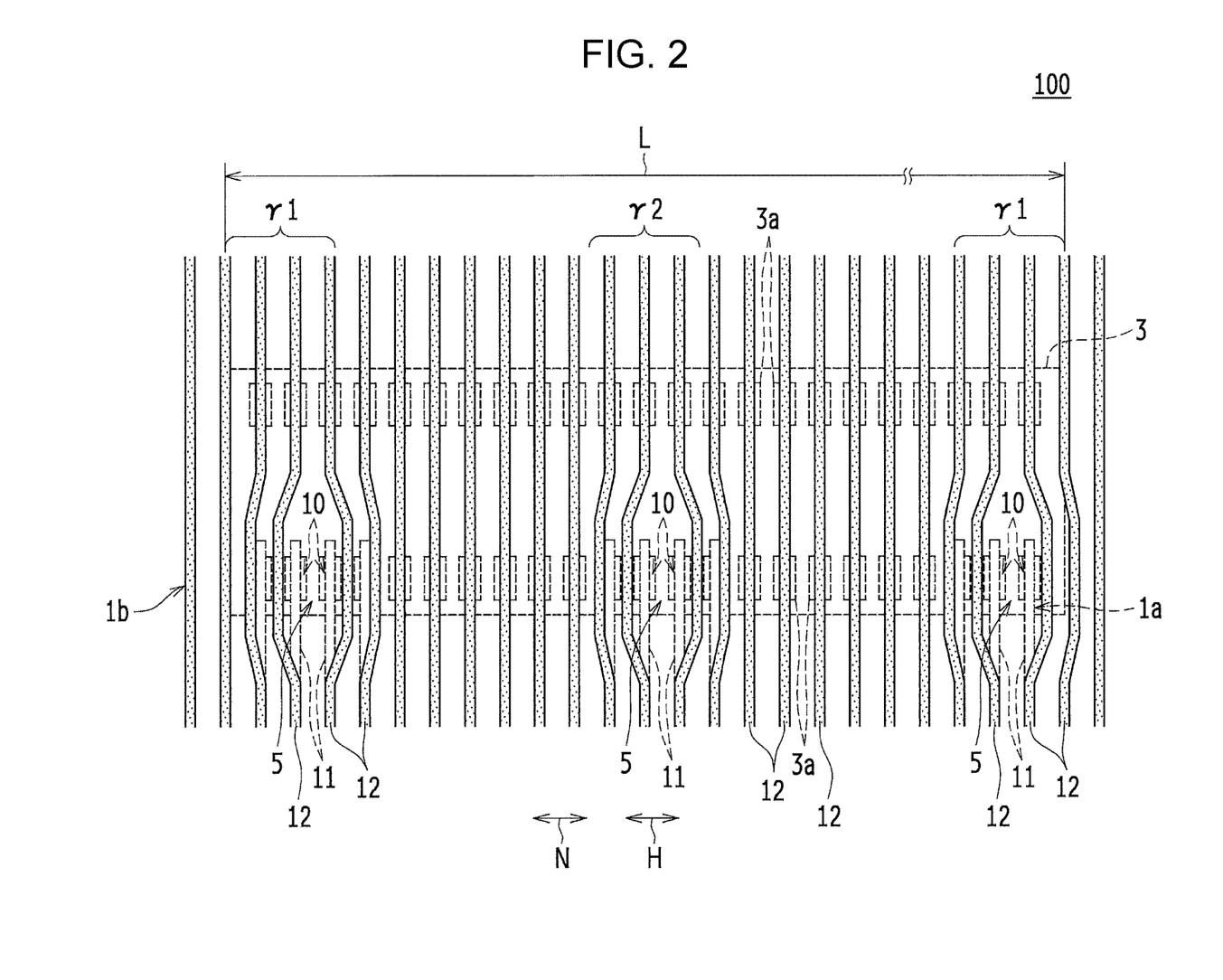
FIG. 2 is a schematic bottom view of the chip-on-film semiconductor device illustrated in FIG. 1, viewed from the surface of the tape carrier opposite to the chip mount surface.

FIG. 1 is a schematic cross-sectional view of an example of a chip-on-film semiconductor device 100 according to embodiment 1 including a double-sided wiring tape carrier 110. FIG. 2 is a schematic bottom view of the chip-on-film semiconductor device 100 illustrated in FIG. 1, viewed from the surface of the tape carrier opposite to the chip mount surface.

The chip-on-film semiconductor device 100 according to embodiment 1 including the double-sided wiring tape carrier 110 includes an insulator film 1, a first wire group 1a (first wiring layer), a second wire group 1b (second wiring layer), first protective layers 2a, a second protective layer 2b, a semiconductor chip 3, and a resin 4. The first protective layers 2a cover the first wire group 1a. The first protective layers 2a are provided to insulate and protect wires 11 of the first wire group 1a. The second protective layer 2b covers the second wire group 1b. The second protective layer 2b is provided to insulate and protect wires 12 of the second wire group 1b. The semiconductor chip 3 is mounted on a first surface 101. The semiconductor chip 3 includes semiconductor connection terminals 3a. The wires 11 of the first wire group a and the semiconductor connection terminals 3a of the semiconductor chip 3 are joined together at junction portions 10. The resin 4 provided to protect and fix the junction portions 10 at which the wires 11 of the first wire group 1a and the semiconductor connection terminals 3a of the semiconductor chip 3 are joined together. The materials and other properties of the insulator film 1, the first wire group 1a, the second wire group 1b, the first protective layers 2a, the second protective layer 2b, and the resin 4 are the same as those of the existing components illustrated in FIG. 12 and FIG. 13, and not described here.

The first wire group 1a including the multiple wires 11 is disposed on the first surface 101 of the translucent insulator film 1. The second wire group 1b including the multiple opaque wires 12 is disposed on a second surface 102 of the insulator film 1, which is opposite to the first surface 101.

The second surface 102 has an unwired region 5 (unwired portion), in which none of the wires 12 of the second wire group 1b is disposed, at at least one portion corresponding to at least one of the junction portions 10.

In the present embodiment, the unwired region 5 disposed at at least one portion of the second surface 102 corresponding to at least one of the junction portions 10 is a region in which none of the wires 12 of the second wire group 1b is disposed. Thus, the state of junctions between the wires 11 of the first wire group 1a and the semiconductor connection terminals 3a can be reliably checked through the unwired region 5 from the second surface 102 on which the second wire group 1b is disposed. This structure achieves high quality. Specifically, the unwired region 5 allows visual recognition of at least one junction portion 10 through the insulator film 1 from the second surface 102.

Specifically, the wires 12 of the second wire group 1b are disposed at portions corresponding to (overlapping) the wires 11 of the first wire group 1a excluding the unwired region 5. The unwired region 5 is a region for a subset of the wires 12 of the second wire group 1b to avoid one junction portion or at least two successive junction portions. On the second surface 102, the wiring pattern of the second wire group 1b is disposed to avoid the unwired region 5. Thus, one junction portion or at least two successive junction portions (two successive junction portions 10, in this example) can be reliably recognized through the unwired region 5 from the second surface 102 on which the second wire group 1b is formed. Thus, the state of junctions between the wires 11 of the first wire group 1a and the semiconductor connection terminals 3a can be reliably checked.

When the translucence of the second protective layer 2b is too low for an operator to recognize the junction portions 10, the method for checking the junction portions 10 may be combined with the use of a high-intensity, high-definition camera (such as a CCD camera) or a high-sensitivity camera (such as an infrared camera). This method facilitates recognition of the junction portions 10.

The unwired regions 5 may be provided in multiple portions. The multiple unwired regions 5 enable an operator to reliably recognize one junction portion or at least two successive junction portions through the unwired regions 5 from the second surface 102 on which the second wire group 1b is disposed.

Figure 3:
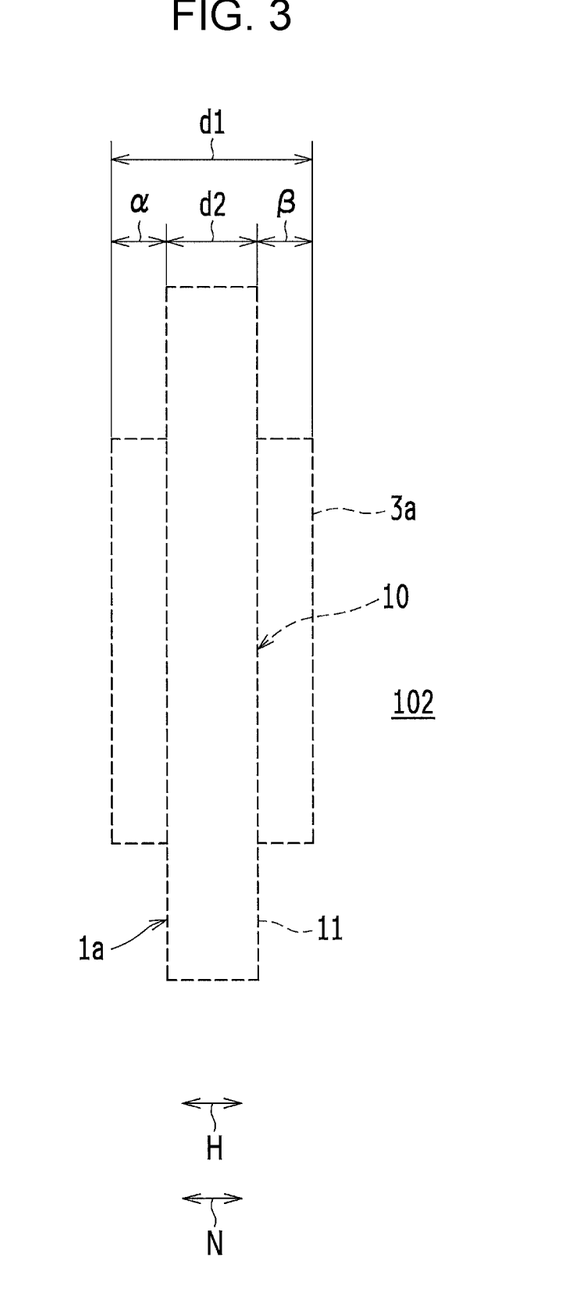
FIG. 3 is an enlarged bottom view of a junction portion illustrated in FIG. 2.

FIG. 3 is an enlarged bottom view of the junction portion 10 illustrated in FIG. 2. As illustrated in FIG. 3, when the first wire group 1a is checked through and from a film surface (second surface 132) on which the second wire group 1b is disposed, a width d1 of the semiconductor connection terminals 3a is larger than a width d2 of the wires 11 of the joined first wire group 1a. Thus, at each junction portion 10, the semiconductor connection terminal 3a is recognized to be partially uncovered by the wire 11 of the first wire group 1a. In FIG. 3, the protrusion amounts on both sides in the width direction H are denoted with α and β. By recognizing the protrusion amounts α and β, an operator can determine whether each wire 11 of the first wire group 1a is joined at the center of the corresponding semiconductor connection terminal 3a in the width direction H. When the protrusion amounts α and β are equal to each other or the difference between the protrusion amounts α and β falls within the allowable range, an operator can recognize that the wire 11 of the first wire group 1a is joined at or around the center of the corresponding semiconductor connection terminal 3a. Thus, an operator can confirm the state of the junction is preferable, without misalignment or other defects.

This structure also enables checking of the following junction state. Generally, the semiconductor connection terminal 3a may be made of gold (Au). The first wire group 1a may be wiring made of copper (Cu) plated with tin (Sn). Here, a eutectic mixture of gold (Au) and tin (Sn) can be formed with heat and pressure. Thus, the wires 11 of the first wire group 1a and the semiconductor connection terminals 3a can be firmly connected together. Here, the state of junctions between the wires 11 of the first wire group 1a and the semiconductor connection terminals 3a can be recognized from the excessive amount of the eutectic mixture.

When the junction states of multiple junction portions are checked through the multiple unwired regions 5 in monitoring during manufacture, products with more stable quality can be manufactured.

In this example, the semiconductor chip 3 is rectangular. The junction portions 10 located around both ends of the rectangular semiconductor chip 3 in the longitudinal direction N are more likely to be affected by the difference in coefficient of thermal expansion between the semiconductor chip 3 and the double-sided wiring tape carrier 110. Thus, junction misalignment between the wires 11 of the first wire group 1a and the semiconductor connection terminals 3a is more likely to occur.

Thus, at least one unwired region 5 is desirably located at a portion/portions corresponding to one or more junction portions 10 in a predetermined area 71 (area within a predetermined distance inward from the end) (see FIG. 2) at at least one end of the semiconductor chip 3 in the longitudinal direction N of toe semiconductor chip 3. Thus, the junction state can be checked around at least one end of the semiconductor chip 3 in the longitudinal direction N. Thus, the junction state of the junction portions 10 located around both ends of the rectangular semiconductor chip 3 in the longitudinal direction N and likely to be affected by the difference in coefficient of thermal expansion can be reliably recognized. Desirably, at least one unwired region 5 is located at a portion/portions corresponding to one or more junction portions 10 in a predetermined area 72 (area including the center) (see FIG. 2) at a center portion in the longitudinal direction N. Thus, the junction state can be checked around the center of the semiconductor chip 3 in the longitudinal direction N. The junction state of the entirety of the junction portions 10 can thus be recognized (assumed).

In the example illustrated in FIG. 2, the junction portions 10 are arranged side by side along the long side of the semiconductor chip 3 drawn with the dotted line. The unwired regions 5 are disposed in the predetermined areas γ1 at both ends of the semiconductor chip 3 in the longitudinal direction N, and in the predetermined area γ2 at the center portion.

At least one of the unwired regions 5 disposed in the predetermined areas 71 at both ends of the semiconductor chip 3 in the longitudinal direction N is desirably disposed to allow an operator to check the junction portion 10 located closest to the short side of the semiconductor chip 3.

In the example illustrated in FIG. 2, the right-end unwired region 5 is disposed to allow an operator to check the junction portions 10 located closest and second closest to one short side of the semiconductor chip 3. The left-end unwired region 5 is disposed to allow an operator to check the junction portions 10 located second closest and third closest to the other short side of the semiconductor chip 3.

This example allows an operator to check the junction portions 10 located closest and second closest to one short side of the semiconductor chip 3 and junction portions 10 located second closest and third closest to the other short side. This structure is not limited to a particular one, and the portions that are checked may be located at any other portions around both ends. For example, each unwired region 5 may be desirably disposed within an area including ten or less junction portions 10 and extending from at least one end of the semiconductor chip 3 in the longitudinal direction N, or within an area extending from at least one end of the semiconductor chip 3 in the longitudinal direction N within 1/10 of the length L (see FIG. 2) of the long side of the semiconductor chip 3.

Embodiment 2

Figure 4:
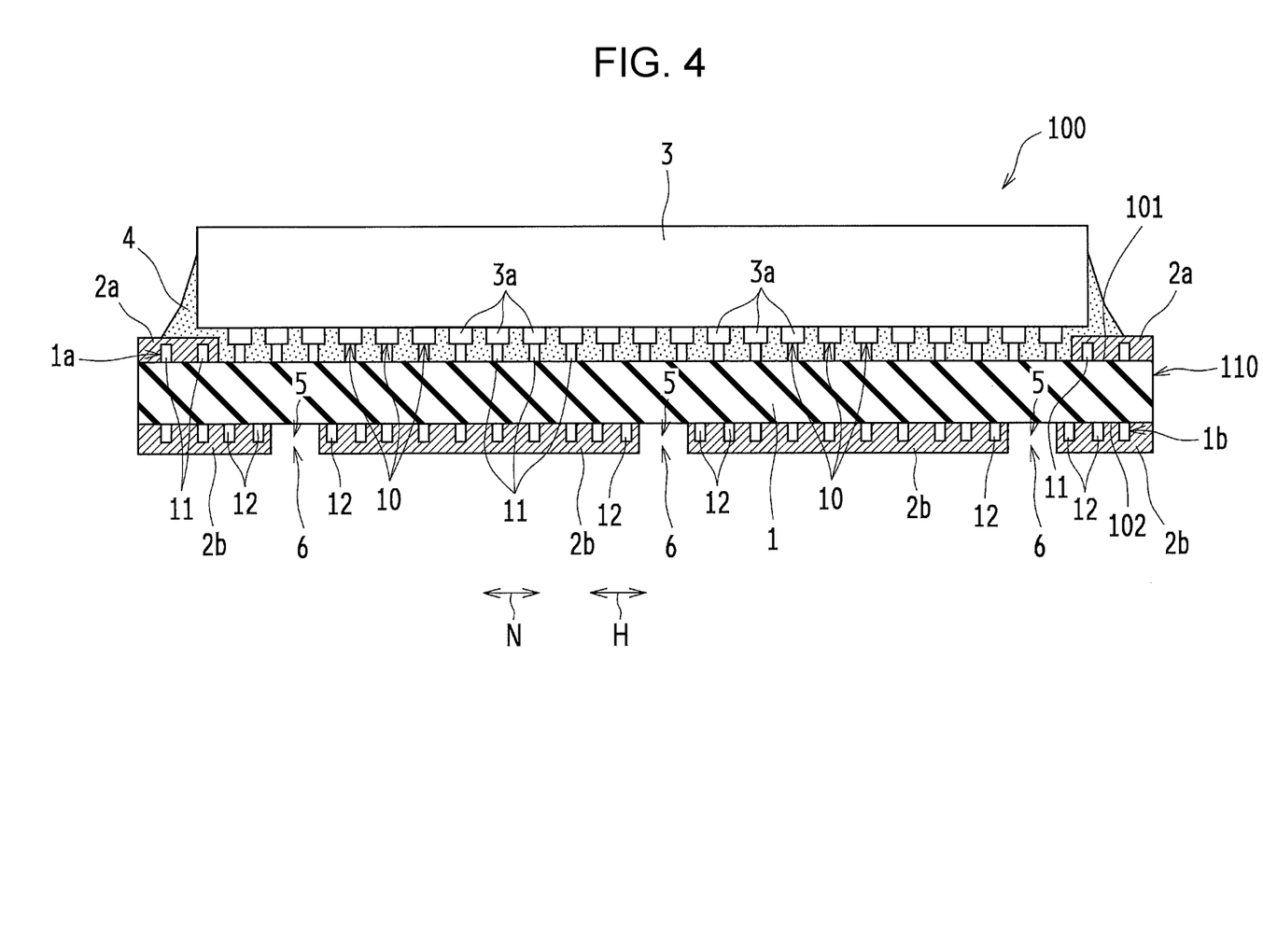
FIG. 4 is a schematic cross-sectional view of an example of a chip-on-film semiconductor device according to embodiment 2.

FIG. 4 is a schematic cross-sectional view of an example of a chip-on-film semiconductor device 100 according to embodiment 2.

As illustrated in FIG. 4, the chip-on-film semiconductor device 100 according to embodiment 2 is formed by forming openings 6, which are open in the second protective layer 2b at the unwired regions 5, in the chip-on-film semiconductor device 100 according to embodiment 1.

The second protective layer 2b has openings at the unwired regions 5. This structure allows an operator to more reliably check one junction portion or at least two successive junction portions (two successive junction portions 10 in this example) at the unwired regions 5 from the second, surface 102 on which the second, wire group 1b is formed.

With the openings 6 formed in the unwired regions 5, only the highly translucent insulator film 1 and resin, 4 are engaged in checking the junction portions 10. Thus, the junction portions 10 can be reliably checked without the use of a high-intensity high-definition camera (such as a CCD camera) or a high-sensitivity camera (such as an infrared camera).

Embodiment 3

Figure 5:
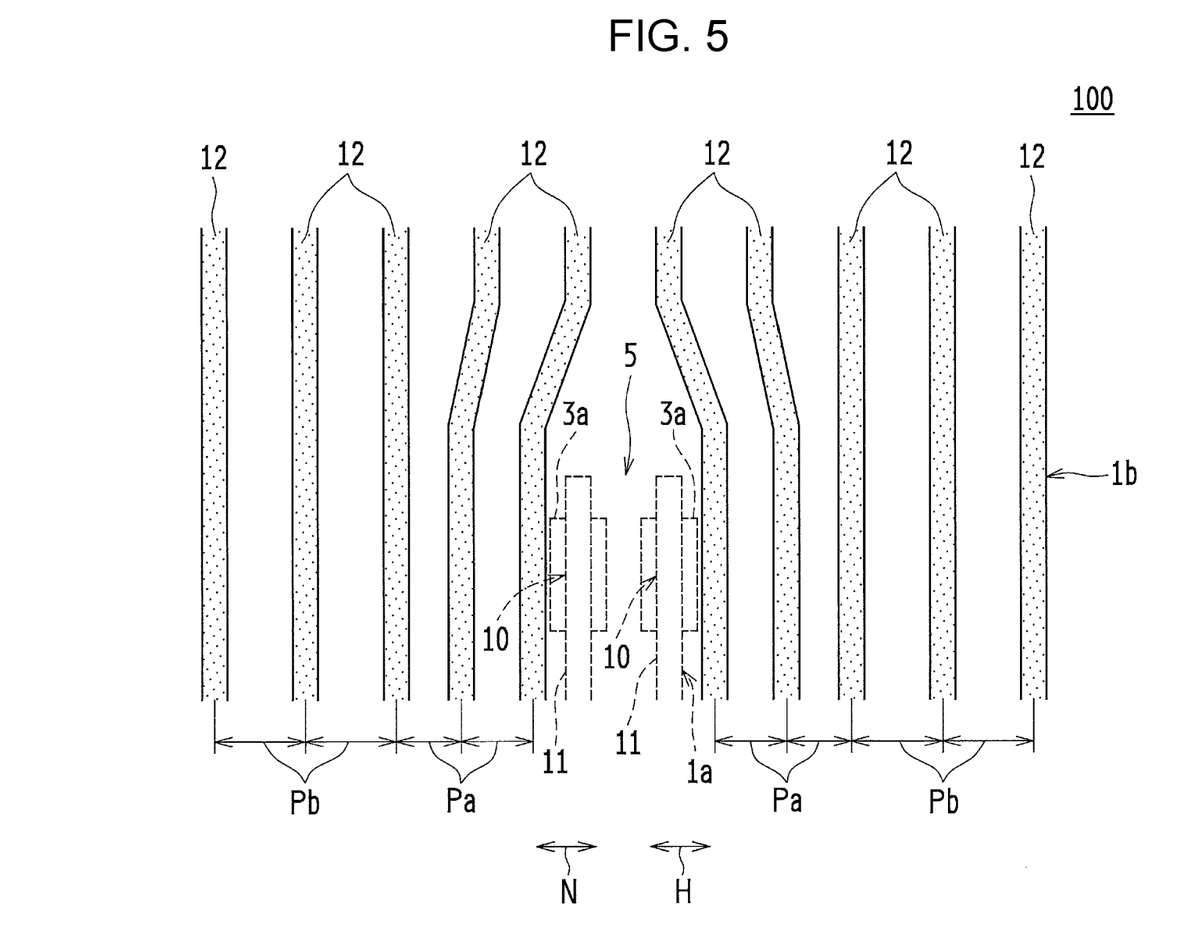
FIG. 5 is an enlarged bottom view of an unwired region and a portion of a second wire group of an example of a chip-on-film semiconductor device according to embodiment 3.

FIG. 5 is an enlarged bottom view of the unwired regions 5 and portions of the second wire group 1b of an example of a chip-on-film semiconductor device 100 according to embodiment 3.

As illustrated in FIG. 5, the unwired region 5 is defined by bent wires 12 of the second wire group 1b around a portion at which the junction portions 10 are recognizable. This structure enables installation of as many effective terminals as possible without additionally installing dummy wires or an unwired region.

FIG. 5 illustrates an example of the second wire group 1b including wires 12 bent to avoid the unwired region 5. Specifically, the wires 12 of the second wire group 1b around the unwired region 5 are arranged at a pitch Pa, which is smaller than a pitch Pb at which the wires 12 in other areas are arranged. Here, for example, the pitch Pa between the wires 12 may be regular, substantially regular, or irregular. The pitch Pb between the wires 12 may be regular or substantially regular.

Embodiment 4

Figure 6:
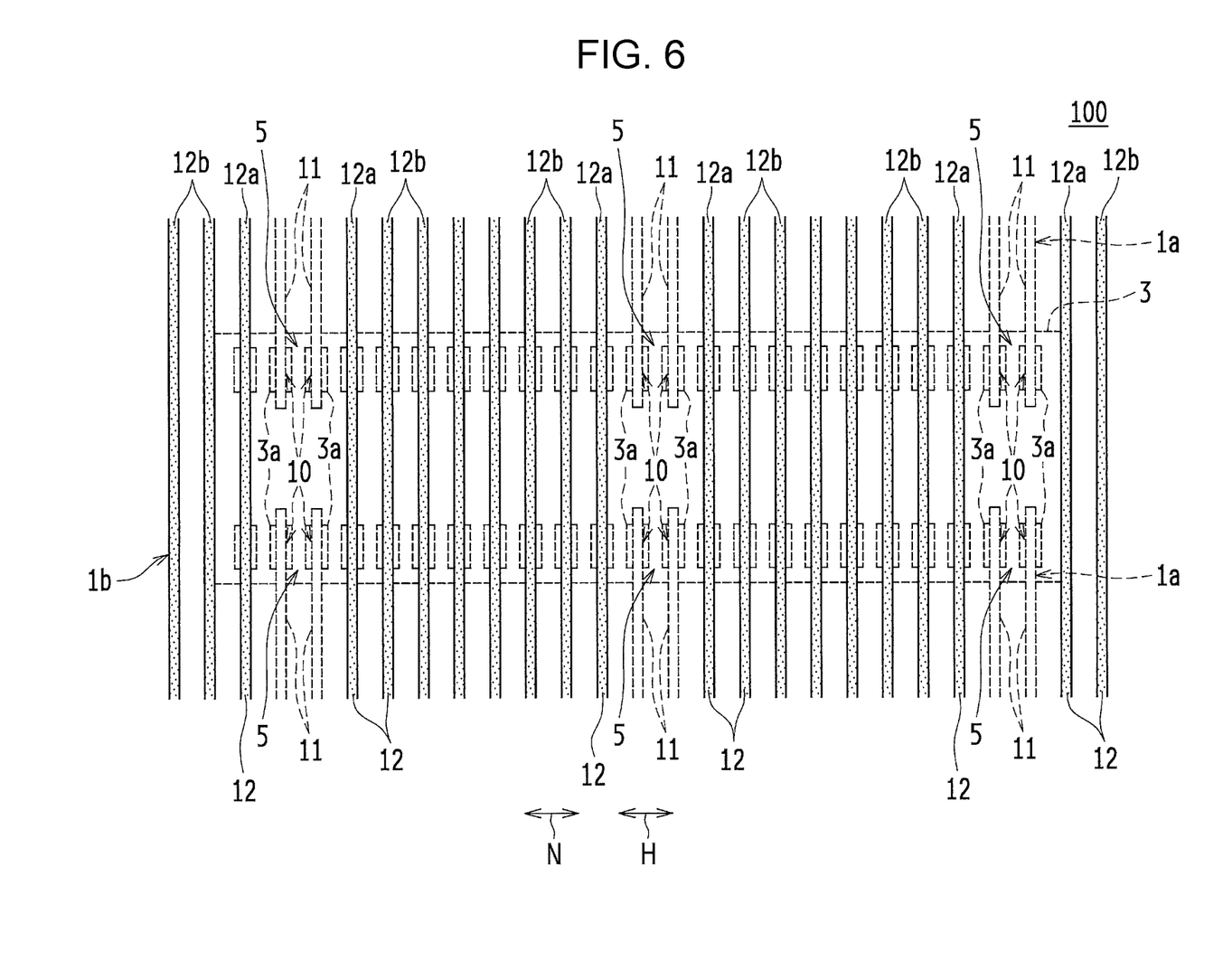
FIG. 6 is a schematic bottom view of an example of a chip-on-film semiconductor device according to embodiment 4, viewed from the surface of a tape carrier opposite to the chip mount surface.
Figure 7:
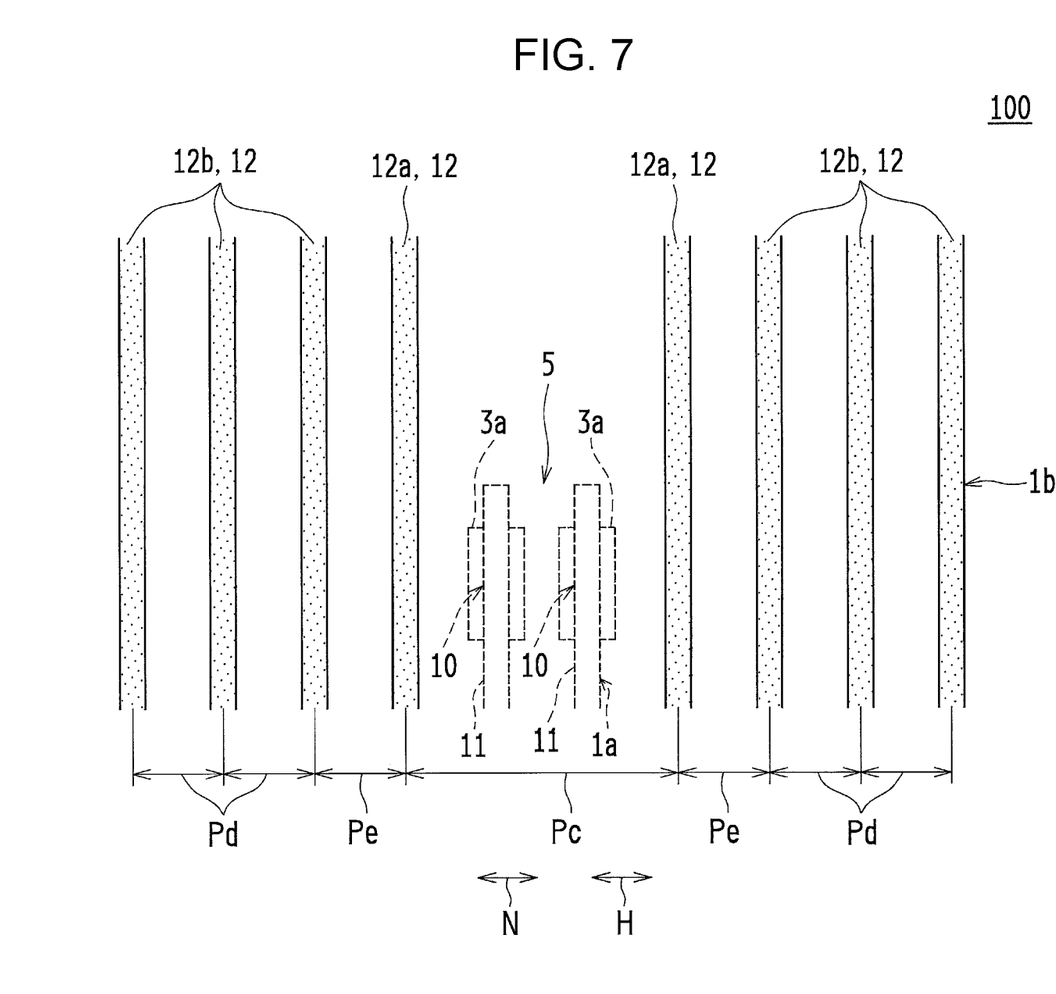
FIG. 7 is an enlarged bottom view of an unwired region and a portion of a second wire group illustrated in FIG. 6.

FIG. 6 is a schematic bottom view of an example of the chip-on-film semiconductor device 100 according to embodiment 4, viewed from the surface of the tape carrier opposite to the chip mount surface. FIG. 7 is an enlarged bottom view of the unwired regions 5 and a portion of the second wire group 1b illustrated in FIG. 6.

As illustrated in FIG. 6 and FIG. 7, at least the wires 12 of the second wire group 1b corresponding to the semiconductor chips 3 are arranged linearly and parallel or substantially parallel to each other. Wires 12a of the wires 12 of the second wire group 1b that define the unwired region 5 are arranged at a pitch Pc (refer to FIG. 7), which is wider than a pitch Pd (refer to FIG. 7), at which wires 12b that do not define the unwired region 5 are arranged. Thus, unlike in embodiment 3, none of the wires 12 are bent to avoid the unwired region 5, although all the wires 12b that do not define the unwired region 5 are arranged at the smaller pitch Pd. This structure facilitates etching during wiring formation.

FIG. 6 and FIG. 7 illustrate an example of the second wire group 1b in which all the wires 12 are translated in the longitudinal direction N to avoid the unwired region 5. Specifically, the wires 12 of the second wire group 1b are arranged such that the two wires 12a adjacent to the unwired region 5 are arranged at the pitch Pc, which is larger than the pitch Pd at which the other wires 12b (not adjacent to the unwired region 5) are arranged, to keep the unwired region 5 from being wired. Here, for example, the pitch Pd between the wires 12b may be regular or substantially regular. A pitch Pe between the wire 12a and the wire 12b may be the same or substantially the same as the pitch Pd.

Embodiment 5

Figure 8:
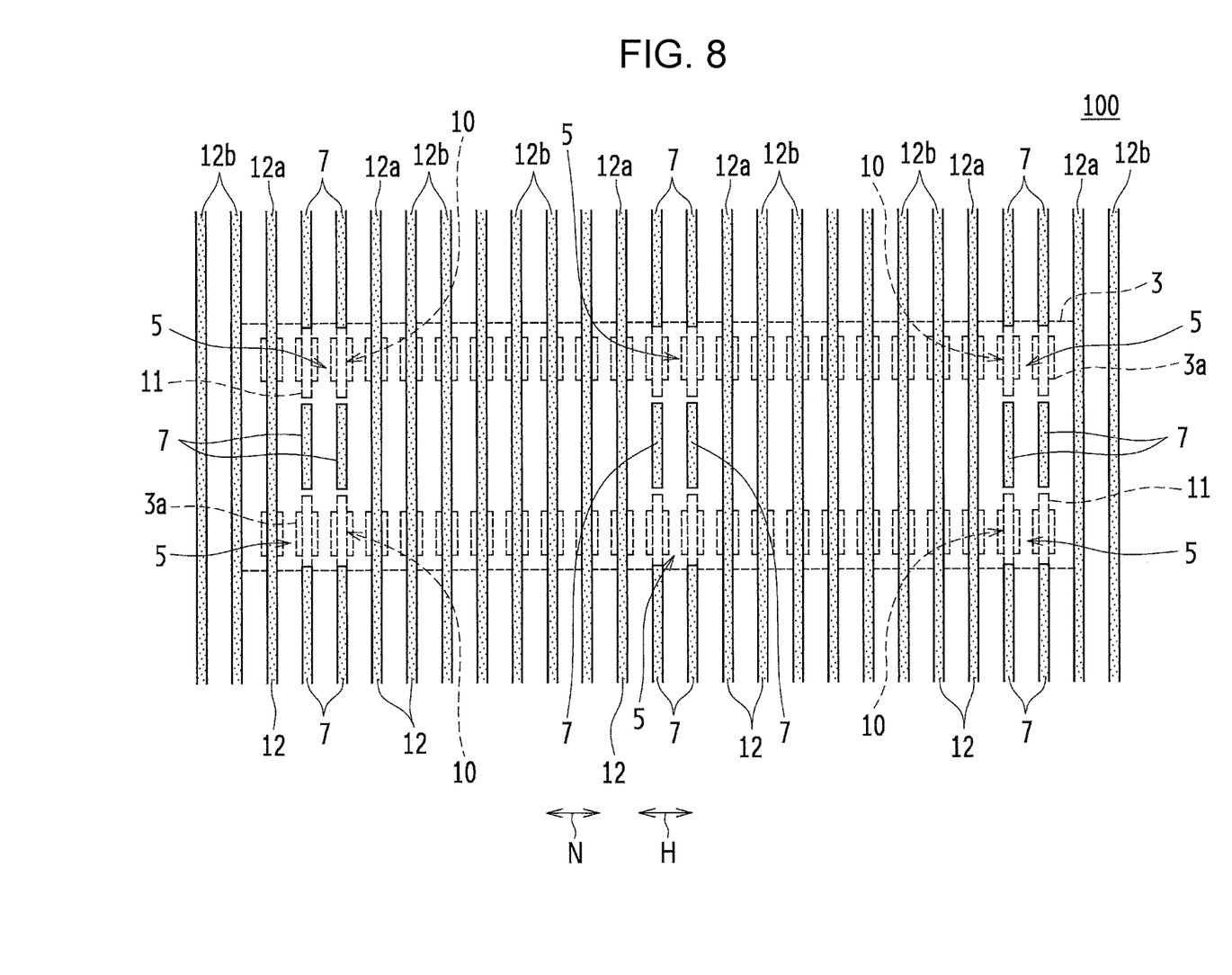
FIG. 8 is a schematic bottom view of an example of a chip-on-film semiconductor device according to embodiment 5, viewed from the surface of the tape carrier opposite to the chip mount surface.
Figure 9:
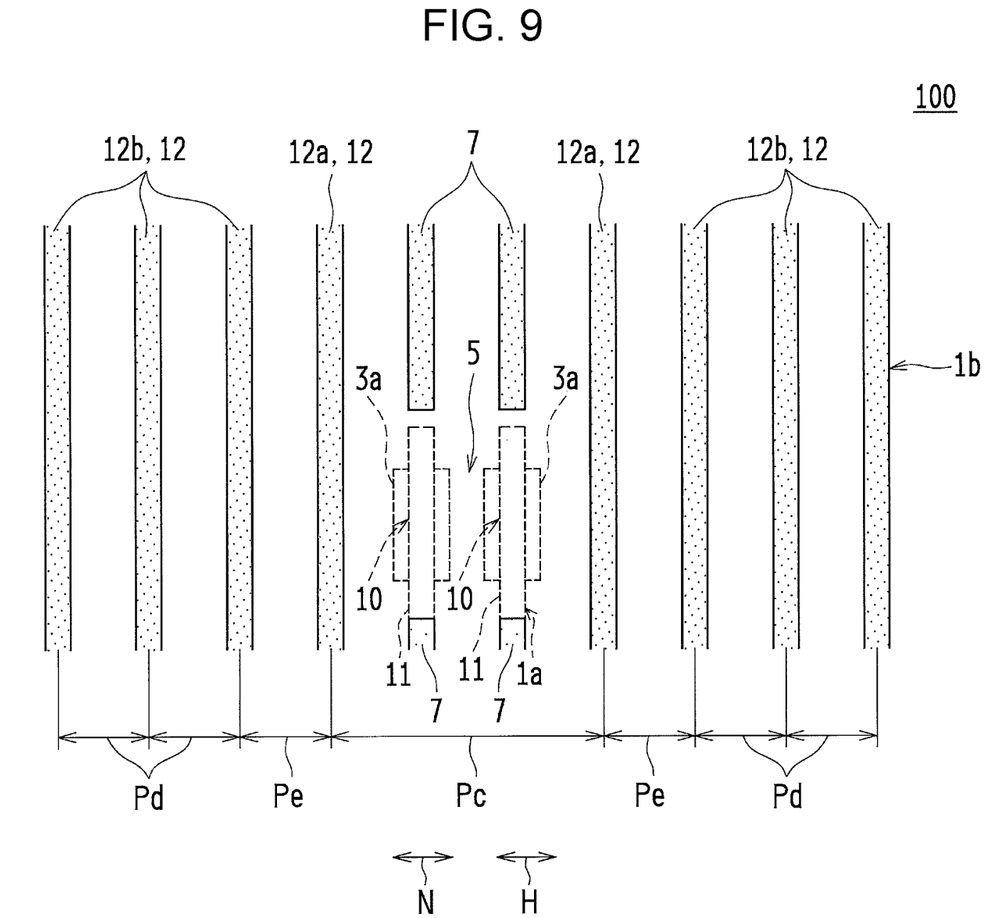
FIG. 9 is an enlarged bottom view of an unwired region and a portion of the second wire group illustrated in FIG. 8.

FIG. 8 is a schematic bottom view of an example of a chip-on-film semiconductor device 100 according to embodiment 5, viewed from the surface of the tape carrier opposite to the chip mount surface. FIG. 9 is an enlarged bottom view of the unwired region 5 and portions of the second wire group 1b illustrated in FIG. 8.

The chip-on-film semiconductor device 100 illustrated in FIG. 8 is formed by adding dummy wires 7 to the chip-on-film semiconductor device 100 according to embodiment 4.

A structure having a portion at which wires 12 are arranged at a wider pitch, as in the case of the pitch Pc of the wires 12a defining the unwired region 5, may have the second protective layer 2b on the wires 12 cracked or subjected to other defects with a stress being exerted on the second protective layer 2b. To avoid this, the chip-on-film semiconductor device 100 according to embodiment 5 includes dummy wires 7 disposed in the area other than the unwired region 5 between the wires 12a (specifically, the center portion) defining the unwired region 5. This structure can disperse the stress exerted on the second protective layer 2b on the wires 12. Thus, the second protective layer 2b is prevented from being cracked or subjected to other defects.

Other Embodiments

The wiring patterns of the first wire group 1a and the second wire group 1b are not limited to those of embodiment 1 to embodiment 5, and may be other wiring patterns.

The present disclosure is not limited to the above-described embodiments and may be embodied in various other forms. The embodiments are mere examples in all respects and not construed as limited. The scope of the present disclosure is defined by the scope of claims, and not restricted to the description. All the modifications or changes belonging to the equivalents to the scope of claims fall within the scope of the present disclosure.

The present disclosure contains subject matter related to that disclosed in Japanese Priority Patent Application JP 2017-229457 filed in the Japan Patent Office on Nov. 29, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A chip-on-film semiconductor device, comprising:
   a translucent insulator film;
   a first wire group including a plurality of wires on a first surface of the insulator film;
   a second wire group including a plurality of opaque wires on a second surface of the insulator film opposite to the first surface; and
   a semiconductor chip mounted on the first surface,
   wherein the wires of the first wire group and semiconductor connection terminals of the semiconductor chip are joined together at junction portions, and
   wherein the second surface includes at least one unwired region, in which none of the wires of the second wire group are disposed, at at least one portion corresponding to at least one of the junction portions.
2. The chip-on-film semiconductor device according to claim 1,
   wherein the unwired region allows at least one of the junction portions to be visually recognized from the second surface through the insulator film.
3. The chip-on-film semiconductor device according to claim 1, further comprising:
   a protective layer disposed to cover the second wire group,
   wherein the protective layer is open at the unwired region.

4. The chip-on-film semiconductor device according to claim 1,
wherein the semiconductor chip is rectangular, and
wherein the unwired region is arranged at at least one portico corresponding to at least one of the junction portions in a predetermined area at at least one end of the semiconductor chip in a longitudinal direction of the semiconductor chip.

5. The chip-on-film semiconductor device according to claim 1,
wherein the unwired region is formed by bending a subset of the wires of the second wire group.

6. The chip-on-film semiconductor device according to claim 1,
wherein a subset of the wires of the second wire group that defines the unwired region is arranged at a pitch wider than a pitch at which the other wires of the second wire group that do not define the unwired region are arranged.

* * * * *